United States Patent
Qian

(10) Patent No.: US 10,083,994 B2
(45) Date of Patent: Sep. 25, 2018

(54) FLEXIBLE DISPLAY PANEL AND DISPLAY DEVICE

(71) Applicant: SHANGHAI TIANMA MICRO-ELECTRONICS CO., LTD., Shanghai (CN)

(72) Inventor: Xu Qian, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/644,825

(22) Filed: Jul. 10, 2017

(65) Prior Publication Data
US 2017/0309652 A1   Oct. 26, 2017

(30) Foreign Application Priority Data

Mar. 2, 2017   (CN) .......................... 2017 1 0119524

(51) Int. Cl.
*H01L 27/12* (2006.01)

(52) U.S. Cl.
CPC ...... *H01L 27/1244* (2013.01); *H01L 27/1218* (2013.01); *H01L 27/1248* (2013.01)

(58) Field of Classification Search
CPC ............. H01L 27/1218; H01L 27/1244; H01L 27/1248
See application file for complete search history.

(56) References Cited

U.S. PATENT DOCUMENTS

| | | | | |
|---|---|---|---|---|
| 5,917,572 A | * | 6/1999 | Kurauchi | ............ G02F 1/13394 349/156 |
| 2014/0055702 A1 | * | 2/2014 | Park | ................. G02F 1/136286 349/43 |

FOREIGN PATENT DOCUMENTS

CN           105074802 A      11/2015

* cited by examiner

*Primary Examiner* — Yosef Gebreyesus
(74) *Attorney, Agent, or Firm* — Kilpatrick Townsend & Stockton LLP

(57) ABSTRACT

The present disclosure relates provide a flexible display panel and a display device. The flexible display panel includes: a flexible substrate; an inorganic layer disposed on the flexible substrate; and signal lines which are arranged in parallel along a first direction and located within the inorganic layer; wherein the signal lines are electrically connected with the display units and extend along a second direction to the wiring area; the inorganic layer includes a signal line spacing area and signal line covering areas; on a plane where the flexible substrate is located, an orthographic projection of the signal line spacing area does not overlap projections of the signal lines, and orthographic projections of the signal line covering areas cover the signal lines; in a direction perpendicular to the flexible substrate, a top end of the signal line spacing area is higher than top ends of the signal line covering areas.

18 Claims, 15 Drawing Sheets

--Prior Art--

# FLEXIBLE DISPLAY PANEL AND DISPLAY DEVICE

CROSS-REFERENCE TO RELATED APPLICATIONS

The present application claims priority to Chinese Patent Application No. 201710119524.6, filed on Mar. 2, 2017, the content of which is incorporated herein by reference in its entirety.

TECHNICAL FIELD

The present application relates to the technical field of flexible display and, particularly, relates to a flexible display panel and a display device.

BACKGROUND

At present, a flexible display screen is not mounted on a glass but on a flexible substrate which includes a display area and a peripheral area. The flexible display panel includes an inorganic layer and signal lines located within the inorganic layer. The inorganic layer is separated into different parts so as to prevent extension of a crack of the inorganic layer after the crack appears.

During implementation of the present disclosure, the inventor has found at least the following problems in the prior art:

During the actual bending of the flexible substrate, a bending device should ideally apply a force that is bearable for the flexible substrate. However, when the bending device is abnormal, the bending device may apply a large force to a certain position of the flexible substrate, which may cause that the signal line at a local area bears excessive high load and thus the signal line may readily break.

SUMMARY

In view of the above, the present disclosure provides a flexible display panel and a display device, which can reduce the probability of breaking of signal lines.

In a first aspect, the present disclosure provides a flexible display panel, including: a flexible substrate including a display area and a peripheral area, wherein the display area includes a plurality of display units, the peripheral area includes a wiring area; an inorganic layer disposed on the flexible substrate; and a plurality of signal lines being parallel along a first direction, wherein the plurality of signal lines is located within the inorganic layer or at a side of the inorganic layer, the side of the inorganic layer is away from the flexible substrate; wherein each of the plurality of signal lines is electrically connected with at least one of the plurality of display units and extends along a second direction to the wiring area; the inorganic layer includes a signal line spacing area and a plurality of signal line covering areas; on a plane where the flexible substrate is located, an orthographic projection of the signal line spacing area does not overlap projections of the plurality of signal lines, and orthographic projections of the plurality of signal line covering areas cover the plurality of signal lines; in a direction perpendicular to the flexible substrate, a top end of the signal line spacing area is higher than top ends of the plurality of signal line covering areas.

In another aspect, an embodiment of the present disclosure provides a flexible display panel including the above flexible display panel.

In the flexible display panel and the display device provided in embodiments of the present disclosure, the top end of the signal line spacing area of the inorganic layer is higher than the top end of the signal line covering area of the inorganic layer, which guarantees that, during bending, the stress is firstly applied to the top end of the signal line spacing area, so as to decrease the force applied to the signal lines and thus reduce the probability of breaking of the signal lines.

BRIEF DESCRIPTION OF DRAWINGS

In order to more clearly illustrate technical solutions in embodiments of the present disclosure, the accompanying drawings necessary for the embodiments are briefly introduced as follows. Obviously, the drawings described as follows are merely part of the embodiment of the present invention, based on which, other drawings can also be acquired by those skilled in the art without paying creative efforts.

DESCRIPTION OF EMBODIMENTS

In order to better understand the technical solutions of the present disclosure, embodiments of the present invention are described in detail as follows with reference to the accompanying drawings.

It should be noted that, the described embodiments are merely part of the embodiment of the present invention but not all the embodiments. Based on the embodiments in the present disclosure, all other embodiments obtained by those skilled in the art without any creative efforts shall fall into the protection scope of the present disclosure.

The terms used in the embodiment of the present invention are merely intended to describe specific embodiments but not to limit the present disclosure. An expression of "a", "the" or "such" in a singular form used in the embodiments and claims of the present disclosure is also intended to include the plural form thereof, unless otherwise noted.

Figure 1:
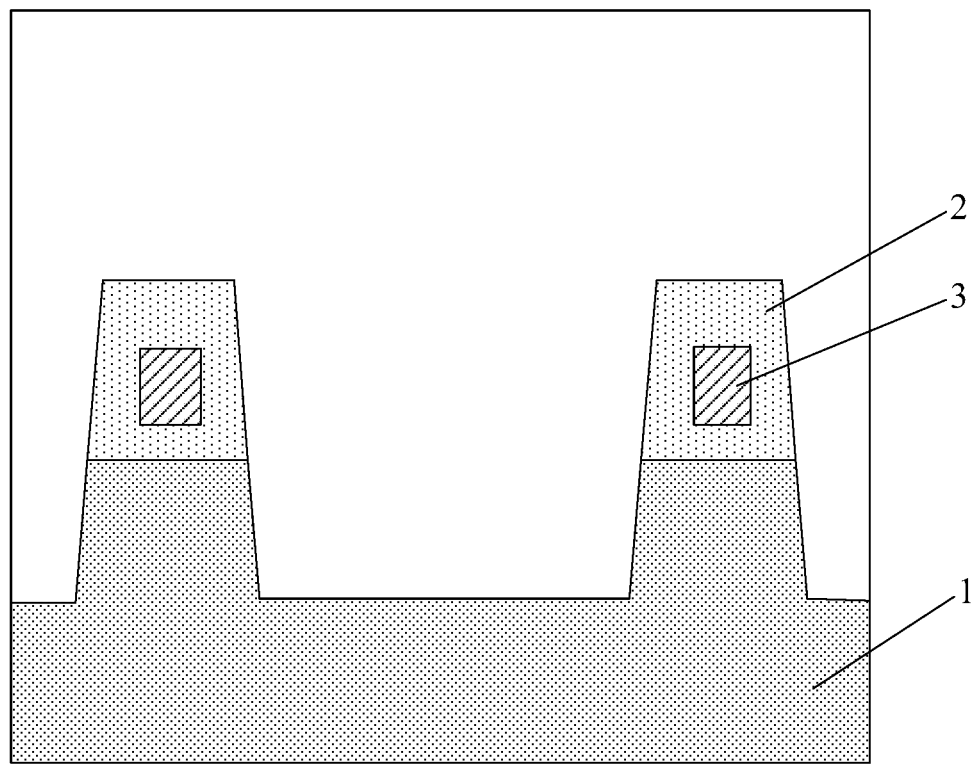
FIG. 1 illustrates a structural schematic diagram of a cross section of a flexible display panel of the prior art.

FIG. 1 illustrates a structural schematic diagram of a cross section of a flexible display panel of the prior art. As shown in FIG. 1, an inorganic layer 2 and signal lines 3 are provided on a flexible substrate 1, and the signal lines 3 are located within the inorganic layer 2. The inorganic layer 2 mainly plays a role of insulating. The inorganic layer 2 is separated into different parts where different signal lines 3 are located to prevent extension of a crack of the inorganic layer 2 after the crack appears. The signal lines 3 extend from the display area to the peripheral area, the peripheral area of the flexible substrate 1 bends toward a side away from the signal lines 3, so that the signal lines 3 are guided to a back surface of the flexible substrate 1 and to be connected with a circuit board at the back surface of the flexible substrate 1.

Figure 2:
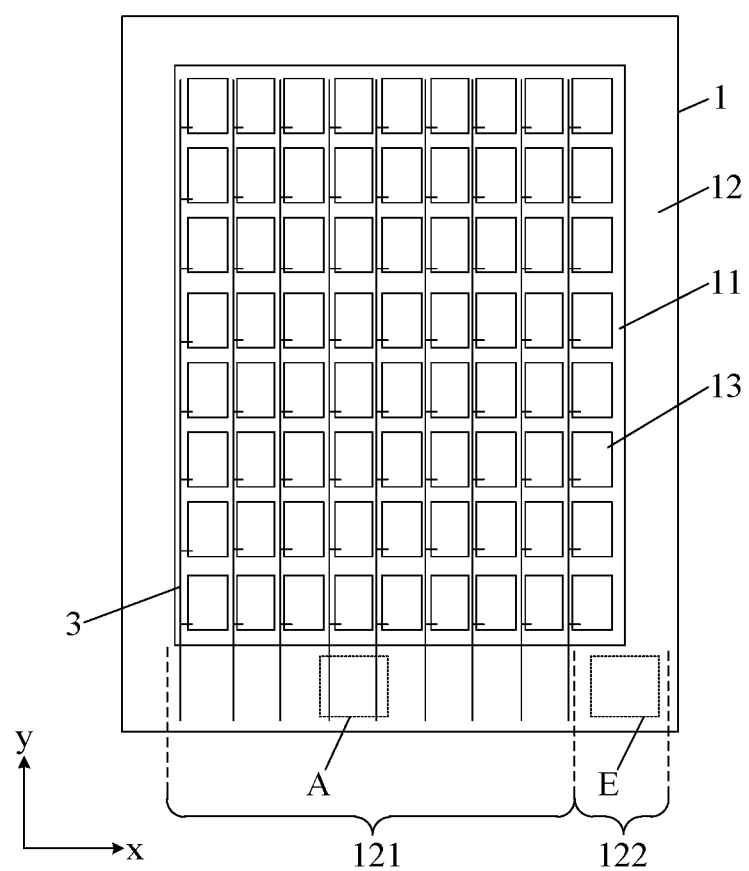
FIG. 2 illustrates a top view of a flexible display panel according to an embodiment of the present disclosure.
Figure 3:
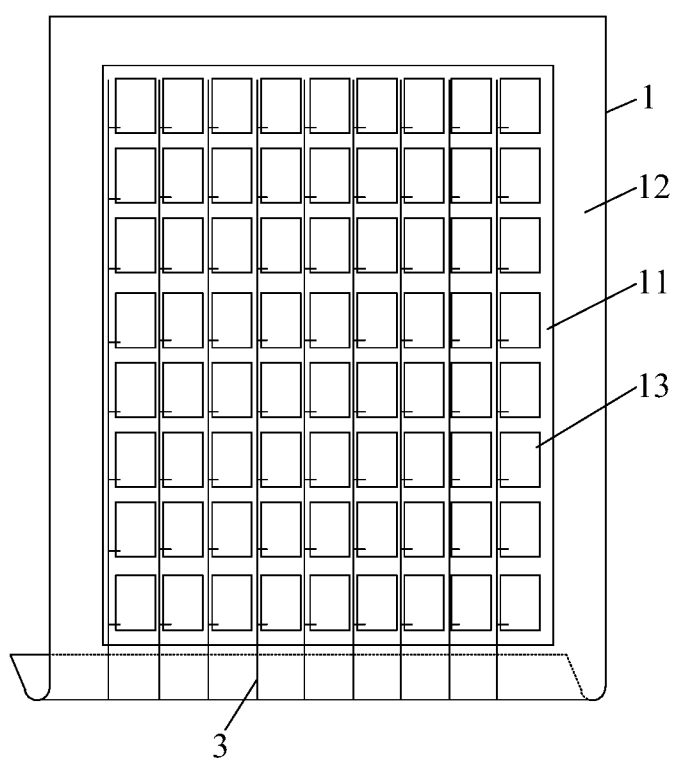
FIG. 3 illustrates a schematic diagram of the flexible display panel of FIG. 2 in a bending state.
Figure 4:
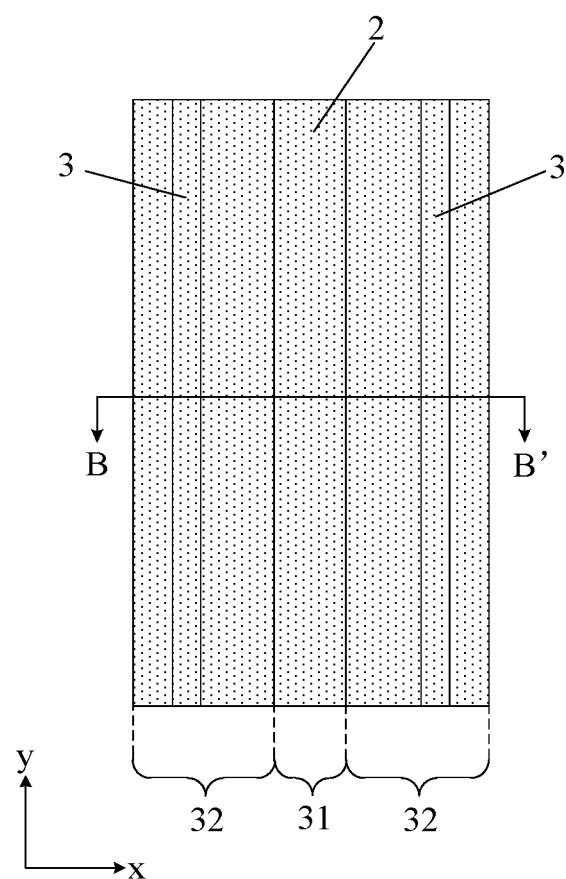
FIG. 4 illustrates a partial enlarged diagram of position A of the flexible display panel of FIG. 2.
Figure 5:
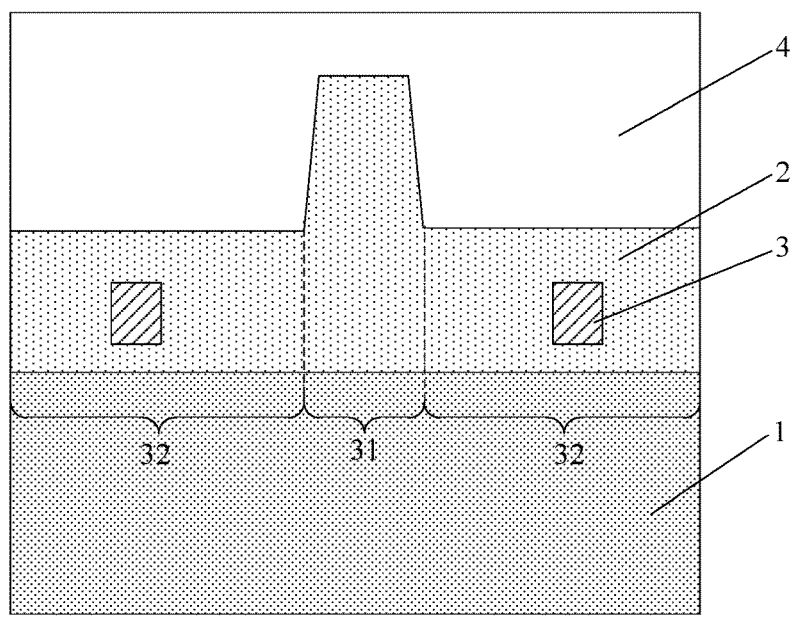
FIG. 5 illustrates a structural schematic diagram of a cross section in BB' direction in FIG. 4.
Figure 6:
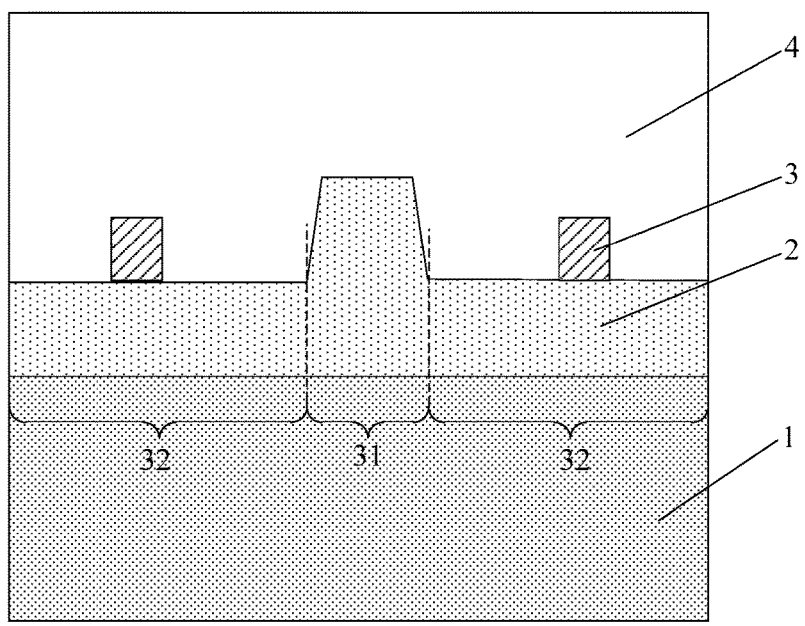
FIG. 6 illustrates another structural schematic diagram of the cross section in BB' direction in FIG. 4.

As shown in FIGS. 2-6, FIG. 2 illustrates a top view of a flexible display panel according to an embodiment of the present invention, FIG. 3 illustrates a schematic diagram of the flexible display panel of FIG. 2 in a bending state, FIG. 4 illustrates a partial enlarged diagram of position A of the flexible display panel of FIG. 2, FIG. 5 illustrates a structural schematic diagram of a cross section in BB' direction in FIG. 4, and FIG. 6 illustrates another structural schematic diagram of the cross section in BB' direction in FIG. 4. An embodiment of the present disclosure provides a flexible display panel, including: a flexible substrate 1, the flexible substrate 1 includes a display area 11 and a peripheral area 12, the display area 11 includes a plurality of display units 13, the peripheral area 12 includes a wiring area 121; an inorganic layer 2 disposed on the flexible substrate 1; and a plurality of signal lines 3 arranged in parallel along a first direction x. As shown in FIG. 5, the signal lines 3 are located within the inorganic layer 2, or, as shown in FIG. 6, the signal lines 3 are located at a side of the inorganic layer 2 far way from the flexible substrate 1. The signal lines 3 are electrically connected with the display units 13 and extend to the wiring area 121 along a second direction y. The inorganic layer 2 includes a signal line spacing area 31 and a plurality of signal line covering areas 32. In a plane where the flexible substrate 1 is located, orthographic projections of the signal line spacing area 31 do not overlap projections of the plurality of signal lines 3, orthographic projections of the plurality of signal line covering areas 32 cover the signal lines 3. In a direction perpendicular to the flexible substrate 1, a top end of the signal line spacing area 31 of the inorganic layer 2 is higher than top ends of the plurality of signal line covering areas 32 of the inorganic layer 2. It should be noted that, in the embodiment of the present invention, the top end of the inorganic layer 2 refers to an end portion of the inorganic layer 2 away from the flexible substrate 1.

The signal lines 3 have poor anti-bending property, as shown in FIG. 3, the peripheral area 12 at a lower side of the display area 11 of the flexible substrate 1 bends toward a side away from the signal lines 3, so that the signal lines 3 are guided to a back surface of the flexible substrate 1 to be connected with a circuit board on the back surface of the flexible substrate 1. During bending, if excessively high local stress occurs, a force will be firstly applied to a higher position of the inorganic layer 2; further, the top end of the signal line spacing area 31 of the inorganic layer 2 is higher than the top end of the signal line covering area 32 of the inorganic layer 2, thus, the top end of the signal line spacing area 31 of the inorganic layer 2 will firstly bear the stress during bending, so that less force will be applied to the signal line covering area 32 of the inorganic layer 2, so as to reduce the force born by the signal lines 3.

In the flexible display panel according to an embodiment of the present disclosure, the top end of the signal line spacing area of the inorganic layer is higher than the top end of the signal line covering area of the inorganic layer, thus, during bending, the stress is firstly applied to the top end of the signal line spacing area of the inorganic layer, so as to reduce the force applied to the signal lines and reduce the probability of breaking of the signal lines.

Optionally, as shown in FIGS. 4-6, the signal line spacing areas 31 of the inorganic layer 2 and the signal line covering areas 32 of the inorganic layer 2 are constructed as an integral structure so that, during manufacturing, the inorganic layer 2 does not need to be separated, so as to simplify processing procedure and reduce cost.

Figure 7:
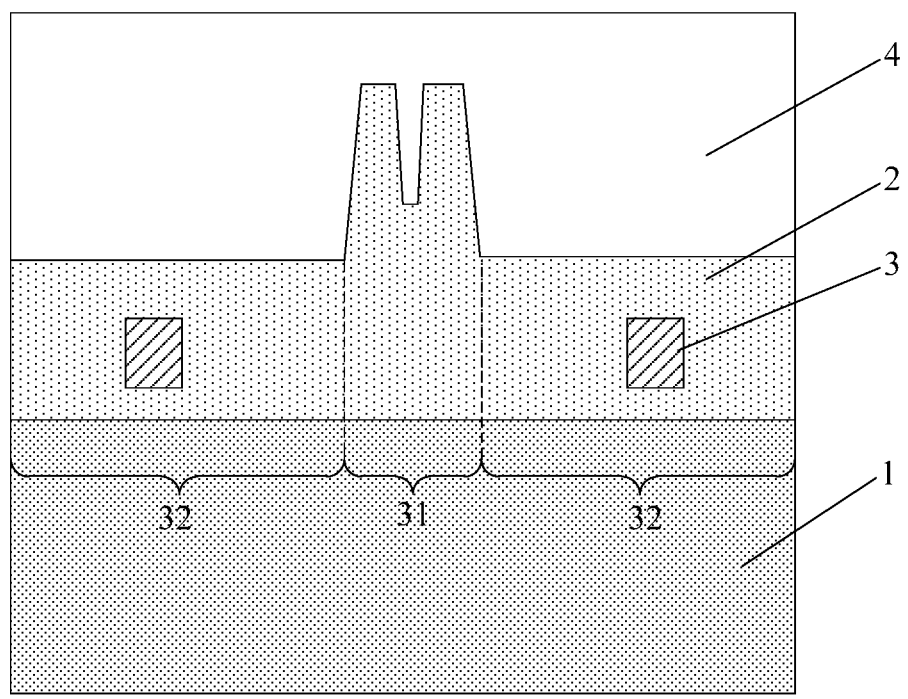
FIG. 7 illustrates another structural schematic diagram of the cross section in BB' direction in FIG. 4.

Optionally, as shown in FIG. 7, FIG. 7 illustrates another structural schematic diagram of the cross section in BB' direction in FIG. 4, the signal line spacing area 31 of the inorganic layer 2 includes at least one groove, the depth of the groove is smaller than the thickness of the signal line spacing area 31. Further, an adhesive layer 4 having good bending property may be disposed on the inorganic layer 2 and thus the groove may be filled with the adhesive layer 4, so as to facilitate bending of the display panel, and improve the contacting area of the adhesive layer with the inorganic layer 2, which can play a certain role of filling and repairing a fracture of the inorganic layer 2 by means of the adhesive layer 4 after the facture appears.

Figure 8:
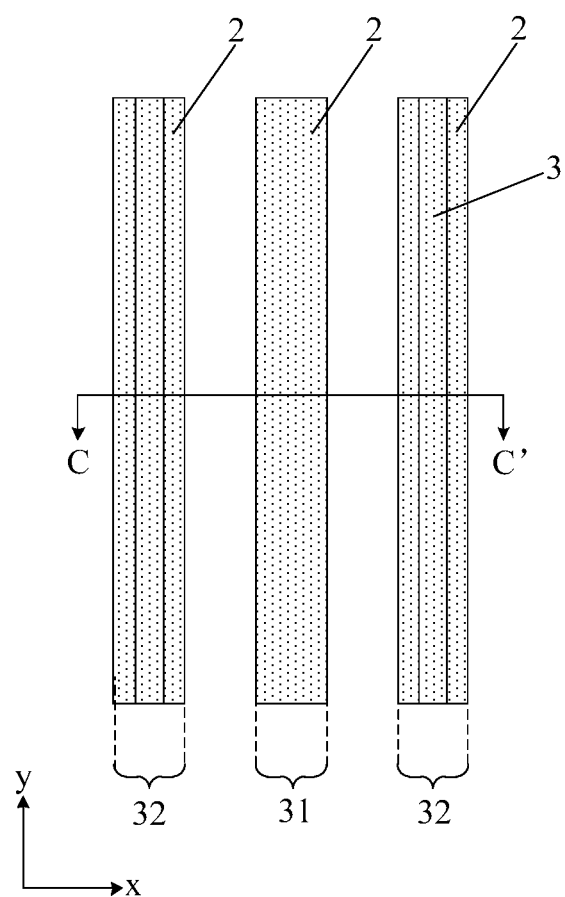
FIG. 8 illustrates another partial enlarged diagram of position A of the flexible display panel of FIG. 2.
Figure 9:
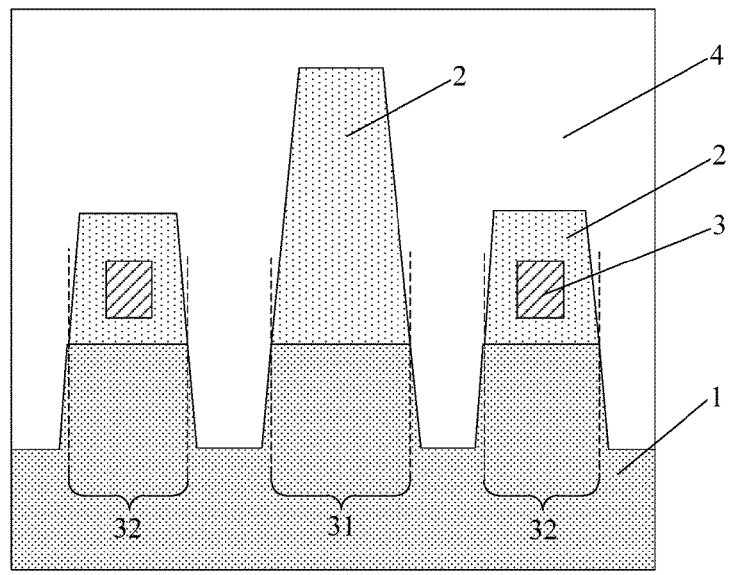
FIG. 9 illustrates a structural schematic diagram of a cross section in CC' direction in FIG. 8.
Figure 10:
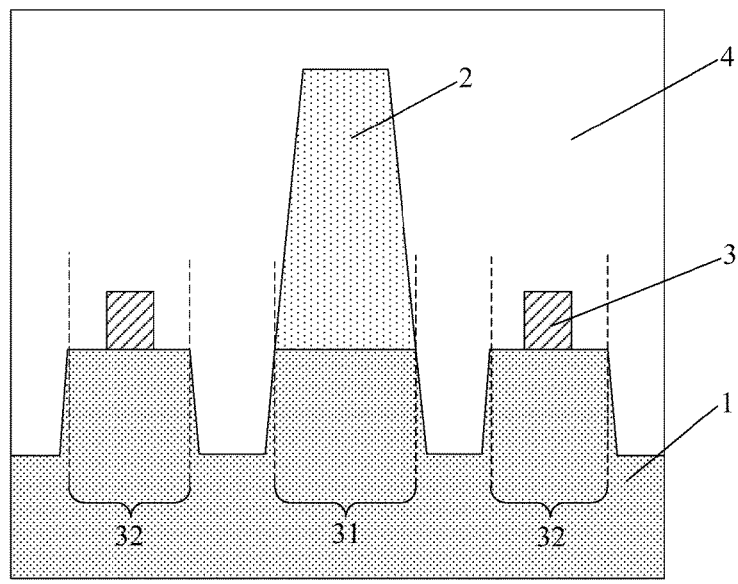
FIG. 10 illustrates another structural schematic diagram of the cross section in CC' direction in FIG. 8.

Optionally, in addition to the above configuration of an integral structure, the inorganic layer 2 may be otherwise configured as a structure shown in FIGS. 8-10, FIG. 8 illustrates another partial enlarged diagram of position A of the flexible display panel of FIG. 2, FIG. 9 illustrates a structural schematic diagram of a cross section in CC' direction in FIG. 8, FIG. 10 illustrates another structural schematic diagram of the cross section in CC' direction in FIG. 8. It is configured that the signal line spacing area 31 and the signal line covering areas 32 of the inorganic layer 2 are separated from each other in the first direction x. Under such structure, if a crack appears at a certain position of the inorganic layer 2 during bending, the crack will not extend to other portions of the inorganic layer 2 along the first direction x.

Optionally, as shown in FIGS. 8-10, a plurality of signal line spacing areas 31 is provided (only one is shown in FIGS. 8-10), each signal line spacing area 31 extends along the second direction y, every two adjacent signal line covering areas 32 are provided with one signal line spacing area 31 therebetween, thus, the inorganic layer 2 (which is higher in position) between any adjacent signal lines 3 firstly bears the bending stress.

Figure 11:
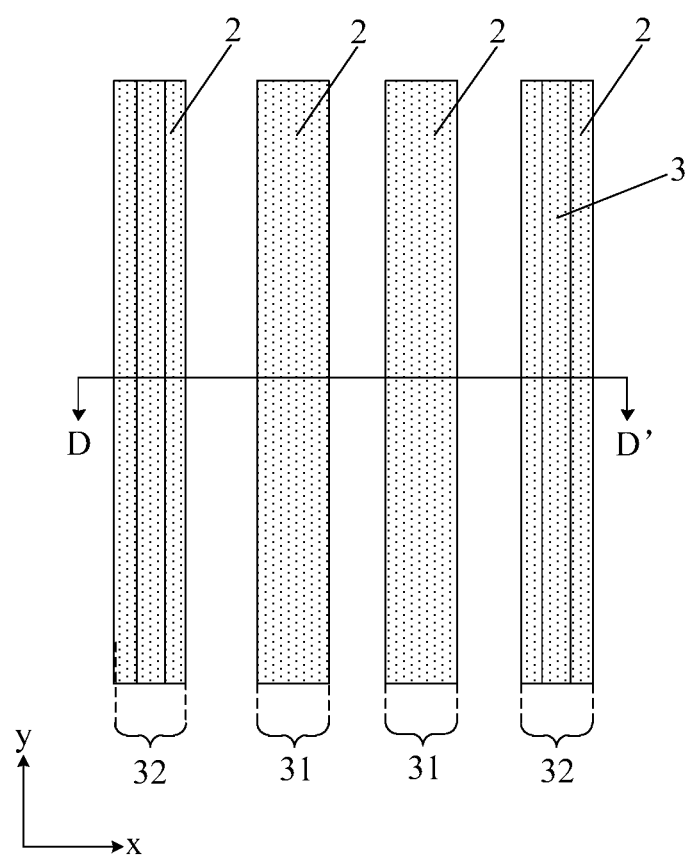
FIG. 11 illustrates another partial enlarged diagram of position A of the flexible display panel of FIG. 2.
Figure 12:
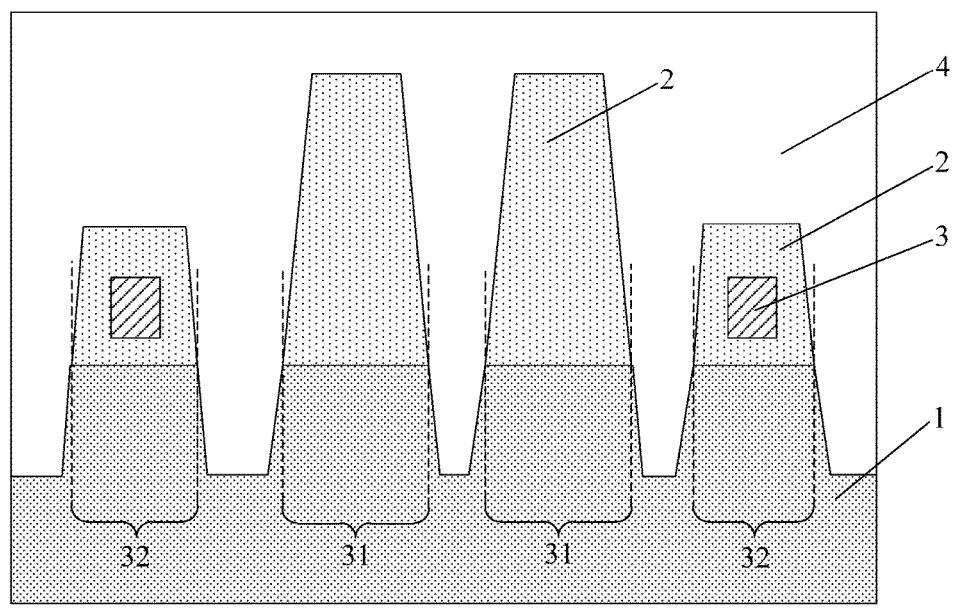
FIG. 12 illustrates a structural schematic diagram of a cross section in DD' direction in FIG. 11.

Optionally, as shown in FIGS. 11-12, FIG. 11 illustrates another partial enlarged diagram of position A of the flexible display panel of FIG. 2, FIG. 12 illustrates a structural schematic diagram of a cross section in DD' direction in FIG. 11. A plurality of signal line spacing areas 31 is provided (only two are shown in FIGS. 11-12), each signal line spacing area 31 extends along the second direction y, every two adjacent signal line covering areas 32 are provided with a plurality of signal line spacing areas 31 therebetween, the plurality of signal line spacing areas 31 of the inorganic layer 2 is separated from each other in the first direction x, which increases the number of disconnections of the inorganic layer 2 in the first direction x, so as to prevent a crack which appears, during bending, at any part of the inorganic layer 2 from extending to other parts of the inorganic layer 2.

Optionally, as shown in FIGS. 9-10, the flexible substrate 1 has recesses, the recesses are strip-like recesses which are arranged along the first direction x and extend along the second direction y. Projections of the strip-like recesses on the inorganic layer 2 are located between the signal line spacing area 31 and the signal line covering area 32, so that the recesses will be filled with an adhesive layer 4 after the adhesive layer 4 is formed, so as to facilitate bending of the display panel.

Optionally, as shown in FIG. 12, the flexible substrate 1 has recesses, the recesses are strip-like recesses which are arranged along the first direction x and extend along the second direction y. Projections of the strip-like recesses on the inorganic layer 2 are located between the signal line spacing area 31 and the signal line covering area 32 and between any two of the plurality of signal line spacing areas 31, so that the recesses will be filled with an adhesive layer 4 after the adhesive layer 4 is formed, so as to facilitate bending of the display panel.

Optionally, one signal line covering area 32 covers one signal line 3, so as to individually protect each signal line 3 and further reduce the probability of breaking of the signal lines 3.

Figure 13:
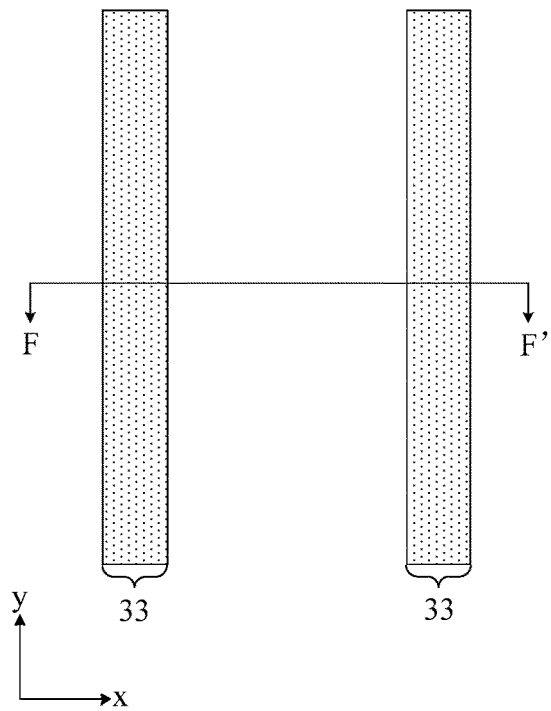
FIG. 13 illustrates a partial enlarged diagram of position E of the flexible display panel of FIG. 2.
Figure 14:
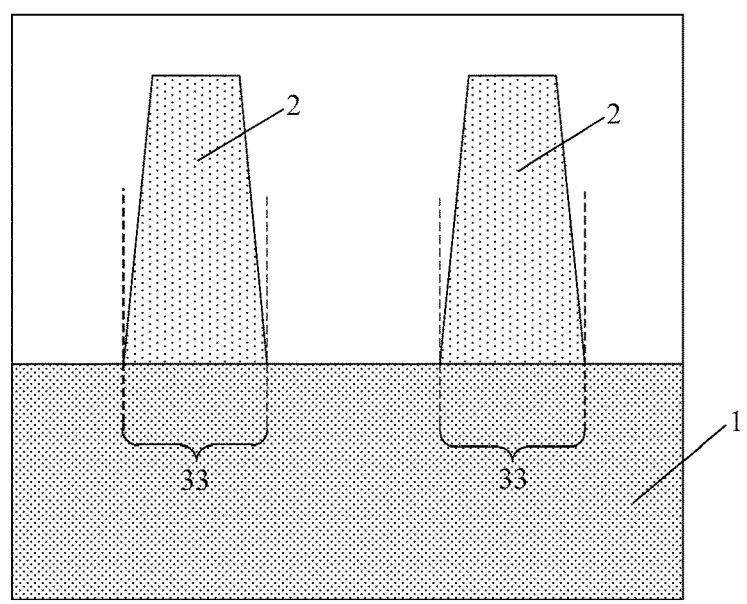
FIG. 14 illustrates a structural schematic diagram of a cross section in FF' direction in FIG. 13.
Figure 15:
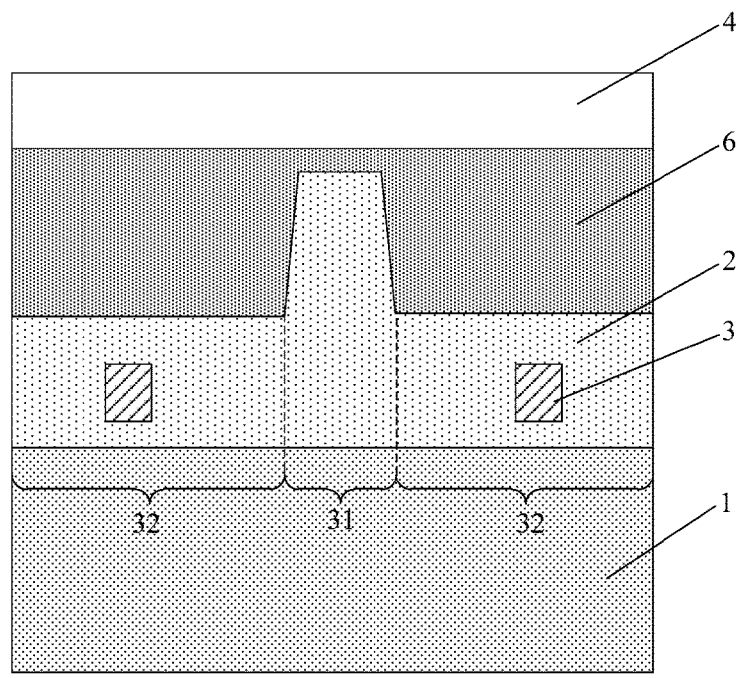
FIG. 15 illustrates another structural schematic diagram of the cross section in BB' direction in FIG. 4.

Optionally, as shown in FIG. 2, FIG. 13 and FIG. 14, FIG. 13 illustrates a partial enlarged diagram of position E of the flexible display panel of FIG. 2, FIG. 14 illustrates a structural schematic diagram of a cross section in FF' direction in FIG. 13. The peripheral area 12 further includes a non-wiring area 122; at the non-wiring area 122, the inorganic layer 2 includes a plurality of strip-like reinforcing areas 33 which is arranged in parallel along the first direction x and extend along the second direction y. In a direction perpendicular to the flexible substrate 1, the top ends of the strip-like reinforcing areas 33 of the inorganic layer 2 are higher than the top ends of the signal line covering areas of the inorganic layer 2. All the signal lines 3 in the display area 11 are wired by way of the wiring area 121, and the signal lines 3 at the peripheral area 12 are bent to the back surface of the flexible substrate 1. No signal line is arranged in the non-wiring area 122 but bending is still necessary for the non-wiring area 122. The non-wiring area 122 of the inorganic layer 2 in the present embodiment also has a higher top end, and the strip-like reinforcing areas 33 in the non-wiring area 122 are configured to be spaced from the signal line in the wiring area 121, so that the anti-bending strength of the whole display panel is improved, and the bending strength is equal in all areas.

Optionally, as shown in FIG. 13, the distance between any two adjacent strip-like reinforcing areas 33 is equal to the distance between any two adjacent signal line spacing areas 31, so that the distribution density of the strip-like reinforcing areas 33 is equal to the distribution density of the signal line spacing areas 31, so as to guarantee uniformity of force born by the display panel during bending.

Optionally, since the heights of the top ends of the strip-like reinforcing areas of the inorganic layer are equal to the heights of the top ends of the signal line spacing area of the inorganic layer, it is guaranteed that, during bending of the flexible substrate, the strip-like reinforcing areas of the inorganic layer and the signal line spacing areas of the inorganic layer can bear a stress at the same time.

Optionally, a material of the flexible substrate includes at least one of polyimide, polycarbonate, poly (ether sulfone), poly (ethylene terephthalate), poly (ethylene naphthalate), compound containing a plurality of aryl groups and fiberglass-reinforced plastic, all of which have better bending property.

Optionally, the above flexible display panel further includes: an adhesive layer 4 located at a side of the inorganic layer 2 away from the flexible substrate 1, as shown in FIG. 6 and FIG. 10, if the signal line 3 is located at a side of the inorganic layer 2 away from the flexible substrate 1, the signal line 3 will be located between the inorganic layer 2 and the adhesive layer 4. The adhesive layer 4 having good bending property may be arranged to directly contact the inorganic layer 2, so as to play a role of filling and repairing the crack of the inorganic layer 2.

Figure 16:
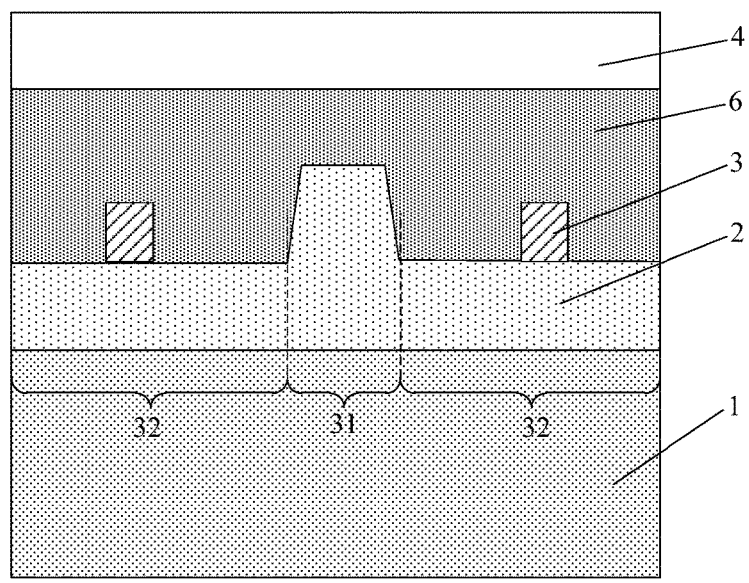
FIG. 16 illustrates another structural schematic diagram of the cross section in BB' direction in FIG. 4.
Figure 17:
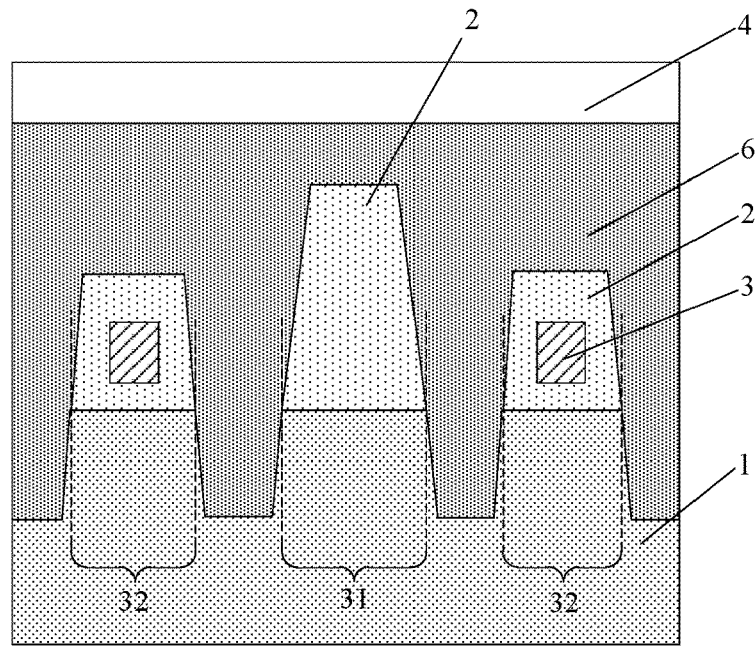
FIG. 17 illustrates another structural schematic diagram of the cross section in CC' direction in FIG. 8.
Figure 18:
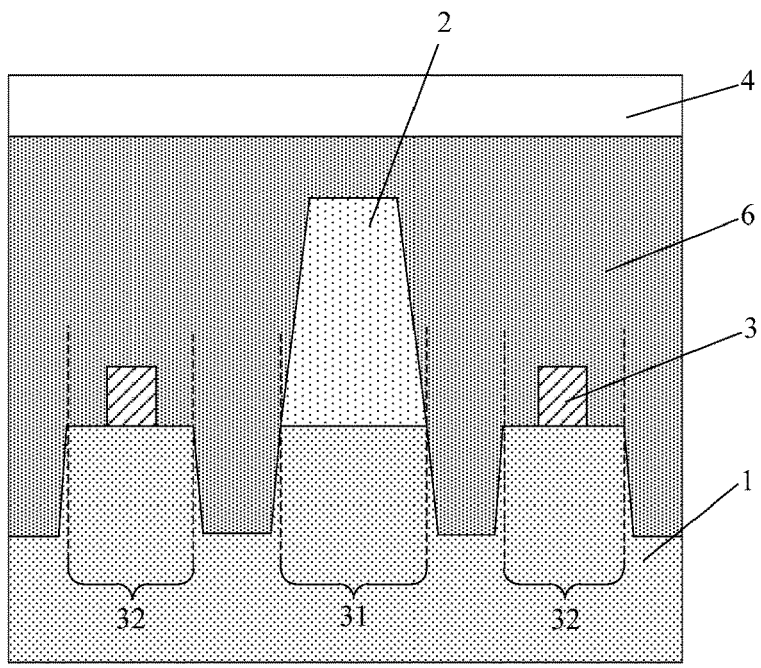
FIG. 18 illustrates another structural schematic diagram of the cross section in CC' direction in FIG. 8.

Optionally, as shown in FIGS. 15-18, FIG. 15 illustrates another structural schematic diagram of the cross section in BB' direction in FIG. 4, FIG. 16 illustrates another structural schematic diagram of the cross section in BB' direction in FIG. 4, FIG. 17 illustrates another structural schematic diagram of the cross section in CC' direction in FIG. 8, and FIG. 18 illustrates another structural schematic diagram of the cross section in CC' direction in FIG. 8. The above flexible display panel further includes: a flat layer 6 located between the inorganic layer 2 and the adhesive layer 4, as shown in FIG. 16 and FIG. 18, if the signal line 3 is located at the side of the inorganic layer 2 away from the flexible substrate 1, the signal line 3 will be located between the inorganic layer 2 and the flat layer 6. By means of the flat layer 6 arranged between the adhesive layer 4 and the inorganic layer 2, the substrate formed with devices such as thin-film transistors can be flattened.

Optionally, as shown in FIG. 6, FIG. 10, FIG. 16 and FIG. 18, if the signal line 3 is located at the side of the inorganic layer 2 away from the flexible substrate 1, in the direction perpendicular to the flexible substrate 1, the top end of the signal line spacing area 31 of the inorganic layer 2 will be higher than the top end of the signal line 3. Thus, during bending of the flexible display panel, the signal line spacing area 31 of the inorganic layer 2 will bear a force earlier than the signal line 3, so as to further reduce the force born by the signal line 3. It should be noted that, in the embodiment of the present invention, the top end of the signal line 3 refers to an end portion of the signal line 3 away from the flexible substrate 1.

Figure 19:
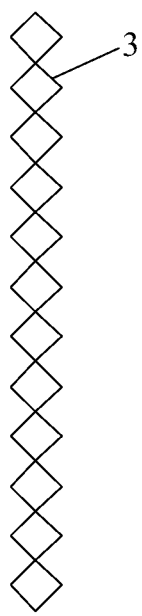
FIG. 19 illustrates a structural schematic diagram of a signal line according to an embodiment of the present disclosure.

Optionally, the above signal lines 3 includes at least one of: data line, scanning line and touch-control signal line. As shown in FIG. 19, FIG. 19 illustrates a structural schematic diagram of a signal line according to an embodiment of the present disclosure, the above signal lines 3 at the peripheral area 12 can be arranged in a double-S shape or other shapes which do not readily break. The signal line 3 is shown in a straight-line shape in other figures, however, the shape of the signal line is not limited in the embodiment of the present invention.

Figure 20:
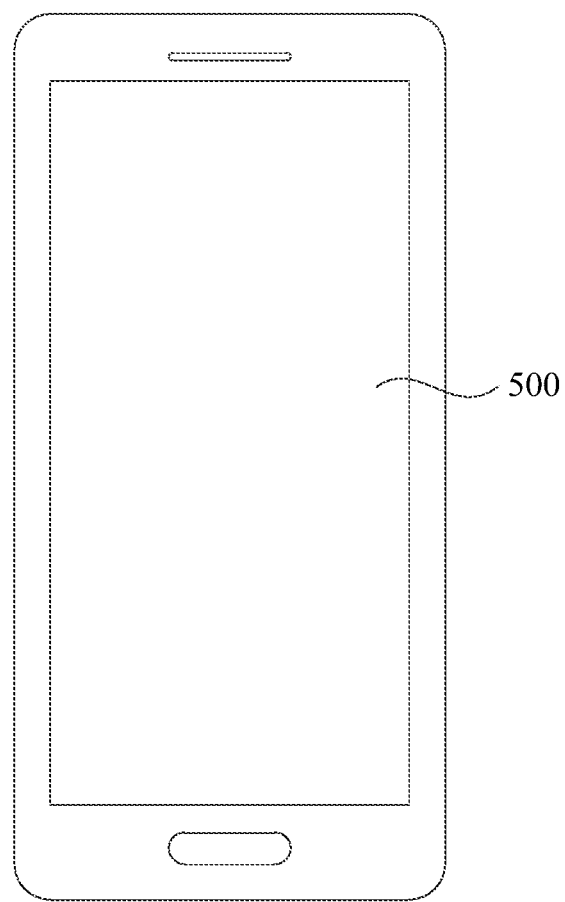
FIG. 20 illustrates a structural schematic diagram of a display device according to an embodiment of the present disclosure.

FIG. 20 illustrates a structural schematic diagram of a display device according to an embodiment of the present disclosure. As shown in FIG. 20, an embodiment of the present disclosure provides a display device including the above-mentioned flexible display panel 500.

The specific structure and mechanism of the flexible display panel 500 are the same as those in the above embodiments, which will not be repeated herein. The display device may be an organic light-emitting diode (Organic Light-Emitting Diode, OLED) display device or other types of display devices, for example, electronic devices having display function, such as touch screens, cell phones, tablet computers, laptops, electronic books and TV sets.

In the display device of the present embodiment, since the top end of the signal line spacing area of the inorganic layer is higher than the top end of the signal line covering area of the inorganic layer, it is guaranteed that, during bending, the force is firstly applied to the top end of the signal line spacing area of the inorganic layer, so as to decrease the force applied to the signal lines and reduce the probability of breaking of the signal lines.

The above are merely preferred embodiments of the present disclosure, which are not used to limit the present disclosure. All the modifications, equivalent substitutions and improvements made within the spirit and principles of the present disclosure shall fall into the protection scope of the present disclosure.

What is claimed is:

1. A flexible display panel, comprising:
a flexible substrate comprising a display area and a peripheral area, wherein the display area comprises a plurality of display units, the peripheral area comprises a wiring area;
an inorganic layer disposed on the flexible substrate; and
a plurality of signal lines being parallel along a first direction, wherein the plurality of signal lines is located within the inorganic layer or at a side of the inorganic layer, the side of the inorganic layer is away from the flexible substrate; and, wherein
each of the plurality of signal lines is electrically connected with at least one of the plurality of display units and extends along a second direction to the wiring area;
the inorganic layer comprises a signal line spacing area and a plurality of signal line covering areas; on a plane where the flexible substrate is located, an orthographic projection of the signal line spacing area does not overlap projections of the plurality of signal lines, and orthographic projections of the plurality of signal line covering areas cover the plurality of signal lines;
in a direction perpendicular to the flexible substrate, a top end of the signal line spacing area is higher than a top end of the plurality of signal line covering areas.

2. The flexible display panel according to claim 1, wherein
the signal line spacing area and the plurality of signal line covering areas are structured as a continuous integrity.

3. The flexible display panel according to claim 2, wherein
at least one groove is defined in the signal line spacing area of the inorganic layer, and a depth of the at least one groove is smaller than a thickness of the signal line spacing area along the direction perpendicular to the flexible substrate.

4. The flexible display panel according to claim 1, wherein
the signal line spacing area and the plurality of signal line covering areas are separated from each other in the first direction.

5. The flexible display panel according to claim 4, wherein
the inorganic layer comprises a plurality of signal line spacing areas, each of the plurality of signal line spacing areas extends along the second direction, and one of the plurality of signal line spacing areas is located between every two adjacent signal line covering areas of the plurality of signal line covering areas.

6. The flexible display panel according to claim 4, wherein
the inorganic layer comprises a plurality of signal line spacing areas, each of the plurality of signal line spacing areas extends along the second direction, at least two of the plurality of signal line spacing areas are located between every two adjacent signal line covering areas of the plurality of signal line covering areas, and the plurality of signal line spacing areas are separated from each other in the first direction.

7. The flexible display panel according to claim 6, wherein
a plurality of recesses is defined in the flexible substrate, the plurality of recesses is strip-like, and is arranged along the first direction and extends along the second direction, and projections of the plurality of recesses on the inorganic layer are located between the signal line spacing area and an adjacent signal line covering area, and between every two of the plurality of signal line spacing areas.

8. The flexible display panel according to claim 4, wherein
a plurality of recesses is defined in the flexible substrate, the plurality of recesses is strip-like, and is arranged along the first direction and extends along the second direction, and projections of the plurality of recesses on the inorganic layer are located between the signal line spacing area and an adjacent signal line covering area.

9. The flexible display panel according to claim 1, wherein
one of the plurality of signal line covering areas covers one of the plurality of signal lines.

10. The flexible display panel according to claim 1, wherein
the peripheral area further comprises a non-wiring area;
the inorganic layer corresponding to the non-wiring area comprises a plurality of strip-like reinforcing areas, the plurality of strip-like reinforcing areas is arranged in parallel along the first direction and extends along the second direction; and
in the direction perpendicular to the flexible substrate, top ends of the plurality of strip-like reinforcing areas are higher than top ends of the plurality of signal line covering areas.

11. The flexible display panel according to claim 10, wherein
a distance between two adjacent strip-like reinforcing areas of the plurality of strip-like reinforcing areas is equal to a distance between two adjacent signal line spacing areas.

12. The flexible display panel according to claim 11, wherein
heights of top ends of the plurality of reinforcing areas are equal to a height of a top end of the signal line spacing area.

13. The flexible display panel according to claim 1, wherein
a material of the flexible substrate comprises at least one of polyimide, polycarbonate, poly (ether sulfone), poly (ethylene terephthalate), poly (ethylene naphthalate), compound containing a plurality of aryl groups and fiber-glass-reinforced plastic.

14. The flexible display panel according to claim 1, further comprising:

an adhesive layer located at the side of the inorganic layer away from the flexible substrate, wherein, if the plurality of signal lines is located at the side of the inorganic layer away from the flexible substrate, the plurality of signal lines is located between the inorganic layer and the adhesive layer.

15. The flexible display panel according to claim 14, further comprising:

a flat layer located between the inorganic layer and the adhesive layer, wherein, if the plurality of signal lines is located at the side of the inorganic layer away from the flexible substrate, the plurality of signal lines is located between the inorganic layer and the flat layer.

16. The flexible display panel according to claim 1, wherein if the plurality of signal lines is located at the side of the inorganic layer away from the flexible substrate, in the direction perpendicular to the flexible substrate, the top end of the signal line spacing area is higher than top ends of the plurality of signal lines.

17. The flexible display panel according to claim 1, wherein the plurality of signal lines comprise at least one of a group of a data line, a scanning line and a touch-control signal line.

18. A display device, comprising a flexible display panel, wherein the flexible display panel comprises:

a flexible substrate comprising a display area and a peripheral area, wherein the display area comprises a plurality of display units, the peripheral area comprises a wiring area;

an inorganic layer disposed on the flexible substrate; and a plurality of signal lines being parallel along a first direction, wherein the plurality of signal lines is located within the inorganic layer or at a side of the inorganic layer, the side of the inorganic layer is away from the flexible substrate; and, wherein each of the plurality of signal lines is electrically connected with at least one of the plurality of display units and extends along a second direction to the wiring area;

the inorganic layer comprises a signal line spacing area and a plurality of signal line covering areas; on a plane where the flexible substrate is located, an orthographic projection of the signal line spacing area does not overlap projections of the plurality of signal lines, and orthographic projections of the plurality of signal line covering areas cover the plurality of signal lines;

in a direction perpendicular to the flexible substrate, a top end of the signal line spacing area is higher than a top end of the plurality of signal line covering area.

* * * * *